(12) United States Patent
Sakagawa et al.

(10) Patent No.: US 7,935,405 B2
(45) Date of Patent: May 3, 2011

(54) FLAME-RETARDANT METAL-COATED FABRIC AND GASKET COMPRISING THE SAME FOR ELECTROMAGNETIC WAVE SHIELDING

(75) Inventors: Sachiyo Sakagawa, Fukui (JP); Toru Takegawa, Fukui (JP); Terufumi Iwaki, Kyoto (JP); Katsuo Sasa, Kyoto (JP)

(73) Assignee: Seiren Co., Ltd., Fukui-shi (JP)

( * ) Notice: Subject to any disclaimer, the term of this patent is extended or adjusted under 35 U.S.C. 154(b) by 752 days.

(21) Appl. No.: 11/918,695

(22) PCT Filed: Apr. 19, 2006

(86) PCT No.: PCT/JP2006/308676
§ 371 (c)(1),
(2), (4) Date: Oct. 17, 2007

(87) PCT Pub. No.: WO2006/112539
PCT Pub. Date: Oct. 26, 2006

(65) Prior Publication Data
US 2009/0068907 A1    Mar. 12, 2009

(30) Foreign Application Priority Data
Apr. 19, 2005   (JP) ................................. 2005-120958

(51) Int. Cl.
*B32B 3/02*    (2006.01)
(52) U.S. Cl. ...................................... 428/66.4; 442/222
(58) Field of Classification Search ............... 442/136, 442/141, 142, 222, 371; 428/66.4, 920, 921
See application file for complete search history.

(56) References Cited

U.S. PATENT DOCUMENTS 3,759,851 A * 9/1973 Carl et al. ..................... 442/139
6,596,893 B2 * 7/2003 Nakacho et al. .............. 558/157
2002/0016119 A1 * 2/2002 Orita et al. ..................... 442/307
2005/0159061 A1 * 7/2005 Iwaki et al. ................... 442/181
2008/0176082 A1 * 7/2008 Sakagawa et al. .......... 428/423.1

FOREIGN PATENT DOCUMENTS

| JP | 2002-198679 | 7/2002 |
|---|---|---|
| JP | 2002-234950 | 8/2002 |
| JP | 2003-247164 | 9/2003 |
| JP | 2005-133054 | 5/2005 |
| JP | 2005-226212 | 8/2005 |
| WO | WO02/34837 | 5/2002 |

* cited by examiner

*Primary Examiner* — Arti Singh-Pandey
(74) *Attorney, Agent, or Firm* — Westerman, Hattori, Daniels & Adrian, LLP

(57) ABSTRACT

A flame-retardant metal-coated fabric which not only has excellent electromagnetic wave shielding properties but has a high degree of flame retardancy without the necessity of containing a halogen compound or antimony compound. It is soft and suffers no deterioration of the metal coating even in long-term use. The flame-retardant metal-coated fabric comprises a metal-coated fabric and a flame-retardant coating layer formed on at least one side of the metal-coated fabric, the flame-retardant coating layer comprising a mixture (F) of the following components (A), (B), (C), (D) and (E):

(A) a flame retardant selected from the group consisting of ammonium polyphosphate and melamine polyphosphate;
(B) a flame-retardant aid selected from the group consisting of melamine, melamine cyanurate, and tris(2-hydroxyethyl)isocyanate;
(C) a blowing agent selected from the group consisting of heat-expandable graphite, azodicarbonamide, and N,N'-dinitrosopentamethylenetetramine:
(D) a phosphoric ester; and
(E) a thermoplastic resin having a melting point of 70-130° C.,
the ratio of (A):(B):(C):(D):(E) being 15-100:50-100:30-60:15-50:100 in weight ratio.

16 Claims, No Drawings

FLAME-RETARDANT METAL-COATED FABRIC AND GASKET COMPRISING THE SAME FOR ELECTROMAGNETIC WAVE SHIELDING

FIELD OF THE INVENTION

The present invention relates to a flame-retardant metal-coated fabric and a gasket comprising the same for electromagnetic wave shielding.

BACKGROUND OF THE INVENTION

As electronic devices, mainly various information terminals, have spread in quick tempo at offices and homes, there is a fear that static electricity and electromagnetic waves generated from those electronic devices may exert an influence on other electronic devices and the human body. In order to prevent troubles caused by such static electricity and electromagnetic waves, there now exists a demand for development of an electromagnetic wave shielding gasket having excellent electromagnetic wave shielding properties and flexibility. Further, under enforcement of the Product Liability Law (PL Law) for example, an electromagnetic wave shielding gasket satisfying the UL Standard, etc. and having a high degree of flame retardancy is keenly desired.

As an example of an electromagnetic wave shielding gasket there is known a gasket using a soft foaming material as a core material and fabric having electric conductivity wound and bonded onto the foaming material. Generally, for producing a soft electromagnetic wave shielding gasket, it is necessary that not only the core material but also the electrically conductive fabric wound round the core material be soft to a satisfactory extent. Moreover, for attaining a high degree of flame retardancy required of the electromagnetic wave shielding gasket, satisfactory flame retardancy is required for all of constituents used, including a core material, an electrically conductive fabric, and an adhesive for bonding the two. To meet this requirement, such compounds as halogen compounds, antimony compounds and phosphorus compounds have heretofore been used as flame retardants. For imparting a high degree of flame retardancy to the gasket in question there have been made various proposals of using those flame retardants in combination to obtain a synergistic effect. On the other hand, as recent products giving consideration to the environment, Electrically conductive fabrics using neither a halogen compound nor an antimony compound and yet having flame retardancy are being developed.

In JP 2003-243873A there is provided a gasket giving consideration to the environment and prepared by laminating a hot melt resin to the surface of an electrically conductive fabric, the hot melt resin containing a flame retardant other than halogen compounds and antimony compounds. The flame retardancy of this gasket satisfies V-1 of UL Standard 94, but does not satisfy V-0 that defies a higher degree of flame retardancy.

In JP 2003-258480A there is disclosed a flame-retardant, electromagnetic wave shielding material of a three-layer laminate structure comprising a filmy support, an electrically conductive thin film formed on one side of the filmy support and an electrically conductive, flame-retardant, adhesive layer. As a flame retardant there is used a phosphorus-based flame retardant which is a non-halogen type, and an electrically conductive powder is used for the purpose of imparting electrical conductivity to the adhesive layer. Such a flame-retardant electromagnetic wave shielding material is deficient in electrical conductivity of the filmy support although consideration is given to the environment. Further, even if material in question has flexibility against bending in only one direction, it is deficient in flexibility against three-dimensional deformations and is therefore unsuitable as an electromagnetic wave shielding gasket.

Further, a laminate produced by adding a flame retardant other than a halogen compound or an antimony compound to a general-purpose synthetic resin, laminating the synthetic resin containing the flame retardant to the surface of an electrically conductive fabric and further laminating thereto a hot-melt resin sheet is known as a material for a gasket. However, in the case of this material, since the number of laminate layers is large, the flexibility of the fabric is impaired and the number of processing steps increases.

OBJECTS OF THE INVENTION

It is an object of the present invention to solve the above-mentioned problems of the prior art. Particularly, it is an object of the present invention to provide a flame-retardant metal-coated fabric suitable as an electromagnetic wave shielding gasket material to be used for shielding electromagnetic waves generated from electronic devices and for counteracting static electricity, the flame-retardant metal-coated fabric having sufficient flexibility and a high degree of flame retardancy without the need of containing a halogen compound or an antimony compound with consideration given to the environment, further, undergoing neither discoloration nor corrosion of the metal coating, as well as an electromagnetic wave shielding gasket using the said fabric.

SUMMARY OF THE INVENTION

Having made extensive studies for achieving the above-mentioned objects, the present inventors found out that aflame-retardant metal-coated fabric having both a high degree of flame retardancy and flexibility and undergoing neither discoloration nor corrosion of a metal coating and with consideration given to the environment could be obtained by forming a flame-retardant coating layer on at least one side of a metal-coated fabric, the flame-retardant coating layer comprising a specific ratio mixture of a flame retardant exclusive of a halogen compound and an antimony compound, a flame-retardant aid, a blowing agent, a phosphoric ester and a thermoplastic resin. On the basis of such a finding we have accomplished the present invention.

More specifically, the present invention firstly resides in a flame-retardant metal-coated fabric comprising a metal-coated fabric and a flame-retardant coating layer formed on at least one side of the metal-coated fabric, the flame-retardant coating layer comprising a mixture (F) of a flame retardant (A) selected from ammonium polyphosphate and melamine polyphosphate, a flame-retardant aid (B) selected from melamine, melamine cyanurate, and tris(2-hydroxyethyl)isocyanate, a blowing agent (C) selected from heat-expandable graphite, azodicarbonamide, and N,N'-dinitrosopentamethylenetetramine, a phosphoric ester (D), and a thermoplastic resin (E) having a melting point of 70-130° C., the ratio of (A):(B):(C):(D):(E) being 15-100:50-100:30-60:15-50:100 in weight ratio.

The present invention secondly resides in a gasket for electromagnetic wave shielding which comprises a core formed by a synthetic resin foam having flame retardancy and the flame-retardant metal-coated fabric as described above, the flame-retardant metal-coated fabric being wound round the outside of the core.

EFFECTS OF THE INVENTION

According to the present invention it is possible to provide a flame-retardant metal-coated fabric having not only excellent electromagnetic wave shielding properties but also a high degree of flame retardancy and flexibility. The flame-retardant metal-coated fabric of the present invention does not contain an antimony compound that is harmful to the human body, nor does it generate any toxic halogen gas, e.g., dioxins, during combustion. Using the flame-retardant metal-coated fabric of the present invention, it is possible to fabricate an electromagnetic wave shielding gasket superior in flexibility through a reduced number of fabrication steps because it is not necessary to use an adhesive separately. Further, with the flame-retardant metal-coated fabric of the present invention, bleedout of the flame retardant is suppressed and discoloration and corrosion of the metal coating do not occur, so that it is possible to maintain excellent electromagnetic wave shielding properties over a long period.

EMBODIMENTS OF THE INVENTION

The present invention will be described below in detail.

The fabric used in the present invention may be, for example, woven or nonwoven fabric or knitted fabric, with no special limitation placed on its form. As examples of employable fiber materials, mention may be made of synthetic fibers such as polyester fibers (e.g., polyethylene terephthalate and polybutylene terephthalate), polyamide fibers (e.g., nylon 6 and nylon 66), polyolefin fibers (e.g., polyethylene and polypropylene), polyacrylonitrile fibers, polyvinyl alcohol fibers, and polyurethane fibers, semisynthetic fibers such as cellulose fibers (e.g., diacetate and triacetate) and protein fibers (e.g., promix), regenerated fibers such as cellulose fibers (e.g., rayon and cuprammonium rayon) and protein fibers (e.g., casein fibers), and natural fibers such as cellulose fibers (e.g., cotton and hemp) and protein fibers (e.g., wool and silk). These may be used each alone or in combination of two or more. Above all, when processability and durability are taken into account, synthetic fibers are preferred and polyester fibers are more preferred. From the standpoint of safety, it is preferable to select fibers not containing a halogen compound or an antimony compound or red phosphorus.

The fiber surface of the fabric comprising any of the above fibers can be coated with metal by a conventional known method such as, for example, vapor deposition, sputtering, electroplating, or electroless plating. Above all, when uniformity of the resulting metal coating and productivity are taken into account, electroless plating or a combination of both electroless plating and electroplating is preferred. To ensure the fixing of metal, it is preferable that impurities such as sizing material, oiling agent and dust adhered to the fiber surface be removed completely before hand by a scouring treatment. The method for the scouring treatment is not specially limited. There may be adopted a conventional known scouring method.

As examples of employable metals, mention may be made of gold, silver, copper, zinc, nickel, and alloys thereof. However, when electrical conductivity and manufacturing cost are taken into account, copper and nickel are preferred. It is preferable that the coating formed by any of those metals have a one- or two-layer structure. A three or more layer structure is not preferable because not only the thickness of the metal coating obtained would become large and the texture of the fabric would become hard, but also the manufacturing cost would become high. In case of forming two metal coating layers by lamination, the same metal may be laminated into two layers, or different metals may be likewise laminated. A suitable method may be selected taking required electromagnetic wave shielding properties and durability into account.

In the flame-retardant metal-coated fabric of the present invention, a flame-retardant coating layer comprising a mixture (F) is formed on at least one side of the above metal-coated fabric, the mixture (F) being a specific ratio mixture of a flame retardant (A), a flame-retardant aid (B), a blowing agent (C), a phosphoric ester (D) and a thermoplastic resin (E).

The flame retardant (A) used in the present invention may be a conventional known compound used heretofore as a flame retardant, provided those containing a halogen compound or an antimony compound are excluded. Such a flame retardant is selected from ammonium polyphosphate and melamine polyphosphate. These compounds may be used each alone or in combination of two or more. It is required that the amount of the flame retardant (A) be 15-100, preferably 40-90, parts by weight based on 100 parts by weight of the thermoplastic resin (E). If the amount of the flame retardant (A) is less than 15 parts by weight based on 100 parts by weight of the thermoplastic resin (E), it will be impossible to impart satisfactory flame retardancy to the flame-retardant metal-coated fabric, and if it exceeds 100 parts by weight, the texture of the same fabric will become rough and hard.

The flame-retardant aid (B) used in the present invention functions to suppress the spread of fire during combustion by thermal decomposition to absorb heat and by dilution of oxygen and combustible gas with inert gas. It is selected from melamine, melamine cyanurate, and tris(2-hydroxyethyl)isocyanate. These compounds may be used each alone or in combination of two or more. It is required that the amount of the flame-retardant aid (B) be 50-100, preferably 60-90, parts by weight based on 100 parts by weight of the thermoplastic resin (E). If the amount of the flame-retardant aid (B) is less than 50 parts by weight based on 100 parts by weight of the thermoplastic resin (E), it will be impossible to impart desired flame-retardant performance to the flame-retardant metal-coated fabric, and if it exceeds 100 parts by weight, the texture of the same fabric will become rough and hard.

The blowing agent (C) used in the present invention functions to suppress the spread of fire during combustion by the formation of a foamed heat insulating layer and by dilution of oxygen and combustible gas with inert gas. It is selected from heat-expandable graphite, azodicarbonamide and N,N'-dinitrosopentamethylenetetramine. These may be used each alone or in combination of two or more. It is required that the amount of the blowing agent (C) be 30-60, preferably 33-50, parts by weight based on 100 parts by weight of the thermoplastic resin (E). If the amount of the blowing agent (C) is less than 30 parts by weight based on 100 parts by weight of the thermoplastic resin (E), it will be impossible to impart desired flame-retardant performance to the flame-retardant metal-coated fabric, and if it exceeds 60 parts by weight, the texture of the flame-retardant metal-coated fabric will become rough and hard.

The phosphoric ester (D) used in the present invention mainly functions to plasticize the flame-retardant coating layer comprising the mixture (F) and does not contain halogen. It is preferable that the phosphorus content of the phosphoric ester (D) be 6-11 wt %, more preferably 8-10 wt %. If the phosphorus content of the phosphoric ester (D) is less than 6 wt %, there is a fear that the flame-retardant performance of the flame-retardant coating layer may be deteriorated, and if it exceeds 11 wt %, there is a fear that the flame-retardant coating layer may be incapable of being plasticized to a satisfactory extent due to a low plasticizing effect.

As examples of the phosphoric ester (D), mention may be made of conventional known compounds such as trimethyl phosphate, triethyl phosphate, tributyl phosphate, tri-2-ethylhexyl phosphate, triphenyl phosphate, tricresyl phosphate, trixylenyl phosphate, cresyldiphenyl phosphate, xylenyldiphenyl phosphate, resorcinol bis(diphenyl phosphate), and bisphenol A bis(diphenyl phosphate). These compounds may be used each alone or in combination of two or more. It is required that the amount of the phosphoric ester (D) be 15-50, preferably 30-40, parts by weight based on 100 parts by weight of the thermoplastic resin (E). If the amount of the phosphoric ester (D) is less than 15 parts by weight based on 100 parts by weight of the thermoplastic resin (E), there is a fear of deficiency in flexibility due to insufficient plasticizing effect, and if it exceeds 50 parts by weight, bleedout of the phosphoric ester may occur or the flame-retardant coating layer comprising the mixture (F) will become sticky when it is formed.

The thermoplastic resin (E) in the present invention is used as a binder resin having the function of fixing the above flame retardant (A), flame-retardant aid (B), blowing agent (C) and phosphoric ester (D) to the metal-coated fabric. The thermoplastic resin (E) also has the function as a hot melt resin for bonding the flame-retardant metal-coated fabric to for example a foamed material serving as a core material in fabricating an electromagnetic wave shielding gasket with use of the flame-retardant metal-coated fabric of the present invention. As examples of the thermoplastic resin (E) used for such a purpose, mention may be made of urethane resin, acrylic resin and polyester resin. These resins may be used each alone or in combination of two or more. Above all, taking flexibility into account, urethane resin and acrylic resin are preferred, with urethane resin being more preferred. Urethane resin is difficult to impair flame retardancy and the texture thereof is soft. For this reason it is particularly preferred in the present invention. The thermoplastic resin (E) has a melting point of 70-130° C., preferably 80-120° C. If the melting point of the thermoplastic resin (E) is lower than 70° C., there is a fear that it may be impossible to carry out a winding work after drying of the coated resin or the coated resin may shift to the back side of the winding during packing and transport. Moreover, during use as a gasket under a high temperature environment, there may occur such a trouble as peeling-off of the resin from the core material. If the melting point of the thermoplastic resin (E) exceeds 130° C., poor adhesion with the urethane foam core is apt to occur in gasket fabrication and thus a gasket of good quality is not obtained. Besides, a higher set temperature is required of a manufacturing machine, with consequent increase of the load on the manufacturing machine.

For the purpose of coloration, texture adjustment and impartment of functionality such as insulating property, other additives may be incorporated in the mixture (F) insofar as the use of such additives does not impair the performance of the mixture. Examples of such additives include elastomers such as silicone rubber, olefin copolymers, modified nitrile rubber and modified polybutadiene rubber, thermoplastic resins such as polyethylene, and pigments.

As the flame retardant (A), flame-retardant aid (B), blowing agent (C), phosphoric ester (D), thermoplastic resin(E) and additives used in the present invention, those available commercially may be used without any special limitation. For example, the thermoplastic resin (E) is available commercially in a dissolved state in an organic solvent and the acquisition thereof is easy.

The flame-retardant metal-coated fabric of the present invention can be produced by applying the mixture (F) containing the above-described flame retardant (A), flame-retardant aid (B), blowing agent (C), phosphoric ester and thermoplastic resin (E) as essential components in a specific ratio to the metal-coated fabric for example by coating to form a flame-retardant coating layer comprising the mixture (F).

As the solvent for dissolving or dispersing the various feed materials there may be used an organic solvent such as, for example, benzene, toluene, xylene, methyl ethyl ketone, or dimethyl formamide. There also may be used a mineral oil fraction such as, for example, industrial gasoline, petroleum naphtha, or terpene. These solvents may be used each alone or in combination of two or more.

The solvent is usually added in a proper quantity so that the viscosity of the mixed treating solution becomes 3000-25000 cps, preferably 8000-20000 cps. If the viscosity of the mixed treating solution is lower than 3000 cps, there is a fear that the mixed treating solution may leak back to the opposite side of the metal-coated fabric, with consequent impairment the appearance quality, and if it exceeds 25000 cps, the coatability will be deteriorated.

For the purpose of preventing such back leakage the metal-coated fabric may be subjected to seal coating beforehand with use of, for example, acrylic resin, polyurethane resin, or polyester resin. The seal coating may be applied to the same side as the side coated with the mixed treating solution or to the opposite side. A pigment may be added to the sealing resin for the purpose of coloration or a flame retardant may be added to the sealing resin for the purpose of improving the flame retardancy. In this case it goes without saying that a flame retardant other than a halogen compound or an antimony compound is to be selected.

Any method may be used for preparing the mixed treating solution insofar as the method adopted permits uniform dispersion and mixing of the feed materials. A generally-adopted method is dispersion and mixing by propeller agitation or by kneading with use of a kneader or roller.

As a coating method there may be adopted a conventional method using, for example, a knife coater, a roll coater, or a slit coater. There also may be adopted a laminating method or a bonding method. After the mixed treating solution is coated onto the metal-coated fabric, the solvent is removed by drying or any other suitable method to form a flame-retardant coating layer comprising the mixture (F).

The amount of the mixed treating solution to be applied to the metal-coated fabric is 100-300 wt %, preferably 150-250 wt %, in terms of the weight of the flame-retardant coating layer comprising the mixture (F). If the amount in question is less than 100 wt %, there is a fear that it may be impossible to attain a high degree of flame retardancy, and if it exceeds 300 wt %, not only the flexibility inherent in the fabric will be lost but also it will be impossible to expect any improvement of flame retardancy.

In this way it is possible to obtain the flame-retardant metal-coated fabric of the present invention. The flame-retardant coating layer comprising the mixture (F) may be formed not only on one side of the fabric but also on both sides of the fabric. After the formation of the flame-retardant coating layer there may be performed a processing for imparting any other functionality to the fabric or such a special processing as calendering.

In case of forming an electromagnetic wave shielding gasket with use of the flame-retardant metal-coated fabric of the present invention, a soft foam rich in compression restorability and having a three-dimensional structure may be used as a core material. As examples of such a foam there are mentioned foams comprising synthetic resins characterized by flame retardancy such as silicone resin and melamine resin, foams prepared by adding a flame retardant to such resins as polyethylene resin, polypropylene resin, polyurethane resin, polyester resin, polyimide resin and polybutadiene resin, followed by foaming, and foams prepared by foaming resins and thereafter applying a flame retardant to the foamed resins by impregnation, coating or spraying. Above all, the foam prepared by foaming the flame retardant-added polyurethane resin is preferred because it is soft, rich in compression restorability, requires less number of manufacturing steps and is very economical. The flame retardant to be used is not specially limited insofar as it is other than a halogen compound, an antimony compound and red phosphorus.

EXAMPLES

The present invention will be described in more detail hereinafter by way of examples, provided the invention is not limited at all by the following examples. The "part" and "%" appearing in the following examples are on a weight basis. Flame-retardant metal-coated fabrics obtained were evaluated for performance by the following methods.

(1) Flame Retardancy

Each flame-retardant metal-coated fabric obtained was wound round and bonded to a flame-retardant core to afford an electromagnetic wave shielding gasket, which was then tested. As the flame-retardant core there was used a urethane foam F-200G (a product of INOAC CORPORATION). This foam was cut into a thickness of 3 mm and a size of 13 mm×125 mm. Further, flame-retardant metal-coated fabric was cut into 33 mm×125 mm and was then wound round the urethane foam F-200G in such a manner that the flame-retardant coating layer came into contact with the urethane foam, followed by ironing at 180° C. for bonding, to fabricate an electromagnetic wave shielding gasket. It goes without saying that the urethane foam F-200G contains neither a halogen compound nor an antimony compound. The electromagnetic wave shielding gasket thus fabricated was evaluated for flame retardancy in accordance with the testing method UL94 V-0.

(2) Hot Melt Adhesiveness

Two 100 mm long by 25 mm wide cut pieces of the flame-retardant metal-coated fabric were provided. The face of the flame-retardant coating layer of one piece and the metal-coated surface of the other piece were superimposed together, then were pressed and bonded together for 2 seconds with an iron of 180° C. Thereafter, the thus-bonded pieces were allowed to stand for 30 minutes within a room, then peeled off from the superimposed portion and measured for adhesive strength using a TENSILON universal testing machine STA-1225 (a product of ORIENTEC CO., LTD.).

(3) Toughness

The flame-retardant metal-coated fabric was measured for toughness in accordance with JIS L 1096A method (45° cantilever method). In the results of this measurement, the smaller the numerical value, the softer the texture.

(4) Environmental Durability

A thermo-hygrostat PR3KPH (a product of TABAI ESPEC CORP.) was set to 60° C., 90% and the flame-retardant metal-coated fabric was left standing therein for 100 hours, followed by evaluation on the following items (4-1), (4-2) and (4-3).

(4-1) Surface Conductivity

Using a resistance value measuring device of Loresta-EP MCP-T360 ESP type (a product of Mitsubishi Chemical Co., Ltd.), a resistance value of the metal-coated surface (the surface free of the flame-retardant coating layer) of the flame-retardant metal-coated fabric was measured.

(4-2) Electromagnetic Wave Shielding Property

In accordance with the KEC method defined by Kansai Electronic Industry Promotion Center an electromagnetic wave attenuation at 10 MHz to 1 GHz was measured using a spectrum analyzer HP8591EM with a tracking generator (a product of Hewlett-Packard Japan, LTD.).

(4-3) Discoloration and Corrosiveness Test for Metal Coating

The metal coating surface before the 100-hour standing in the thermo-hygrostat and the same surface after 100 hours were observed for discoloration and corrosion in a comparative manner.

Examples 1-2 and Comparative Examples 1-4

Example 1

(Preparing Metal-Coated Woven Fabric)

A polyester fiber woven fabric (warp 56dtex/36f, weft 56dtex/36f) was subjected to scouring, drying and heat treatment, then was immersed in a 40° C. aqueous solution containing 0.3 g/L of palladium chloride, 30 g/L of stannous chloride and 300 ml/L of 36% hydrochloric acid for 2 minutes, and thereafter was washed with water. Subsequently, the fabric was immersed in fluoroboric acid of 30° C. having an acid concentration of 0.1N for 5 minutes and was then washed with water. Next, the fabric was immersed in an electroless copper plating solution of 30° C. containing 7.5 g/L of copper sulfate, 30 ml/L of formalin and 85 g/L of Rochelle salt for 5 minutes and was then washed with water. Thereafter, the fabric was immersed in a 35° C. electrolytic nickel plating solution of pH 3.7 containing 300 g/L of nickel sulfamate, 30 g/L of boric acid and 15 g/L of nickel chloride for 10 minutes at an electric current density of 5 A/dm$^2$, allowing nickel to be deposited, followed by washing with water. As a result, the fabric was plated with 10 g/m$^2$ of copper and 4 g/m$^2$ of nickel. The weight of the metal-coated fabric thus treated was 64 g/m$^2$.

One side of the metal-coated fabric thus treated was coated with sealing resin of the following Formulation 1 by means of a knife, then was dried at 130° C. for 1 minute. The amount of the resin applied was 4 g/m$^2$ in terms of a solids content. Next, a mixed treating solution of the following. Formulation 2 was coated onto the same side of the fabric with use of a knife, followed by drying at 130° C. for 2 minutes. The amount of the solution applied was 130 g/m$^2$ in terms of a solids content.

Formulation 1

| | |
|---|---|
| TOAACRON SA-6218 (acrylic resin, solids content 18%, a product of TOHPE CORP.) | 100 parts |
| RESAMINE UD crosslinking agent (isocyanate crosslinking agent, solids content 75%, a product of Dainichiseika Color & Chemicals Mfg. Co., Ltd.) | 1.5 parts |
| Toluene | proper quantity |

Viscosity was adjusted to 15000 cps by adjusting the amount of toluene.

Formulation 2

| | |
|---|---|
| Ammonium polyphosphate | 22 parts (73.3) |
| Melamine | 25 parts (83.3) |
| Heat-expandable graphite | 11 parts (36.7) |
| Tricresyl phosphate | 10 parts (33.3) |
| Ester type urethane resin (m.p. 90° C.) | 30 parts (100) |

| | |
|---|---|
| Dimethylformamide | 43 parts |
| Methyl ethyl ketone | proper quantity |

Viscosity was adjusted to 8000 cps by adjusting the amount of methyl ethyl ketone.

Example 2

One side of a metal-coated woven fabric prepared by plating in the same way as in Example 1 was coated with sealing resin of the following Formulation 3 with use of a knife, followed by drying at 130° C. for 1 minute. The amount of the resin applied was 6 g/m$^2$ in terms of a solids content. Next, a mixed treating solution of the following Formulation 4 was coated onto the same side of the fabric with use of a knife, followed by drying at 130° C. for 2 minutes. The amount of the solution applied was 130 g/m$^2$ in terms of a solids content.

Formulation 3

| | |
|---|---|
| TOAACRON SA-6218 (acrylic resin, solids content 18%, a product of TOHPE CORP.) | 100 parts |
| RESAMINE UD crosslinking agent (isocyanate crosslinking agent, solids content 75%, a product of Dainichiseika Color & Chemicals Mfg. Co., Ltd.) | 1.5 parts |
| Cyclic phenoxyphosphazene | 8.5 parts |
| Tricresyl phosphate | 2.5 parts |
| Toluene | proper quantity |

Viscosity was adjusted to 18000 cps by adjusting the amount of toluene.

Formulation 4

| | |
|---|---|
| Ammonium polyphosphate | 25 parts (83.3) |
| Melamine cyanurate | 25 parts (83.3) |
| Heat-expandable graphite | 11 parts (36.7) |
| Bisphenol A bis(diphenyl phosphate) | 12 parts (40) |
| Ester type urethane resin (m.p. 90° C.) | 30 parts (100) |
| Dimethylformamide | 43 parts |
| Methyl ethyl ketone | proper quantity |

Viscosity was adjusted to 8000 cps by adjusting the amount of methyl ethyl ketone.

Comparative Example 1

One side of a metal-coated woven fabric prepared by plating in the same way as in Example 1 was coated with the sealing resin of Formulation 1 with use of a knife, followed by drying at 130° C. for 1 minute. The amount of the resin applied was 4 g/m$^2$ in terms of a solids content. Next, a mixed treating solution of the following Formulation 5 was coated onto the same side of the fabric with use of a knife, followed by drying at 130° C. for 2 minutes. The amount of the solution applied was 130 g/m$^2$ in terms of a solids content.

Formulation 5

| | |
|---|---|
| Ammonium polyphosphate | 50 parts (166.7) |
| Melamine cyanurate | 5 parts (16.7) |
| Heat-expandable graphite | 2 parts (6.7) |
| Bisphenol A bis(diphenyl phosphate) | 2 parts (6.7) |
| Ester type urethane resin (m.p. 90° C.) | 30 parts (100) |
| Dimethylformamide | 43 parts |

Viscosity was adjusted to 8000 cps by adjusting the amount of dimethylformamide.

Comparative Example 2

One side of a metal-coated woven fabric prepared by plating in the same way as in Example 1 was coated with the sealing resin of Formulation 1 with use of a knife, followed by drying at 130° C. for 1 minute. The amount of the resin applied was 5 g/m$^2$ in terms of a solids content. Next, a mixed treating solution of the following Formulation 6 was coated onto the same side of the fabric with use of a knife, followed by drying at 130° C. for 2 minutes. The amount of the solution applied was 130 g/m$^2$ in terms of a solids content.

Formulation 6

| | |
|---|---|
| Cyclic phosphonic ester | 25 parts (83.3) |
| Melamine cyanurate | 20 parts (66.7) |
| Heat-expandable graphite | 18 parts (60) |
| Bisphenol A bis(diphenyl phosphate) | 15 parts (50) |
| Ester type urethane resin (m.p. 90° C.) | 30 parts (100) |
| Dimethylformamide | 43 parts |

Viscosity was adjusted to 8000 cps by adjusting the amount of dimethylformamide.

As the cyclic phosphonic ester there was used an 8:2 (weight ratio) mixture of (5-ethyl-2-methyl-1,3,2-dioxaphosphorinane-5-yl)methyldimethyl phosphonate-P-oxide and bis[(5-ethyl-2-methyl-1,3,2-dioxaphosphorinane-5-yl)methyl]methylphosphonate-P,P'-dioxide.

Comparative Example 3

One side of a metal-coated woven fabric prepared by plating in the same way as in Example 1 was coated with the sealing resin of Formulation 1 with use of a knife, followed by drying at 130° C. for 1 minute. The amount of the resin applied was 4 g/m$^2$ in terms of a solids content. Next, a mixed treating solution of the following Formulation 7 was coated onto the same side of the fabric with use of a knife, followed by drying at 130° C. for 2 minutes. The amount of the solution applied was 130 g/m$^2$ in terms of a solids content. Further, an ester type hot melt urethane sheet was laminated to the same side to form an adhesive layer.

Formulation 7

| | |
|---|---|
| Ammonium polyphosphate | 30 parts (100) |
| Melamine cyanurate | 24 parts (80) |
| Heat-expandable graphite | 11 parts (36.7) |
| Bisphenol A bis(diphenyl phosphate) | 15 parts (50) |
| Ester type urethane resin (m.p. 150° C.) | 30 parts (100) |
| Dimethylformamide | 43 parts |

Viscosity was adjusted to 8000 cps by adjusting the amount of dimethylformamide.

Comparative Example 4

One side of a metal-coated woven fabric prepared by plating in the same way as in Example 1 was coated with the sealing resin of Formulation 1 with use of a knife, followed by drying at 130° C. for 1 minute. The amount of the resin applied was 4 g/m² in terms of a solids content. Next, a mixed treating solution of the following Formulation 8 was coated onto the same side of the fabric with use of a knife, followed by drying at 130° C. for 2 minutes. The amount of the solution applied was 130 g/m².

Formulation 8

| | |
|---|---|
| Nonether bromine compound | 47 parts (156.7) |
| Antimony trioxide | 24 parts (80) |
| Bisphenol A bis(diphenyl phosphate) | 14 parts (46.7) |
| Ester type urethane resin (m.p. 90° C.) | 30 parts (100) |
| Dimethylformamide | 26 parts |

Viscosity was adjusted to 8000 cps by adjusting the amount of dimethylformamide.

Evaluation results obtained in the above Examples and Comparative Examples are shown in Table 1 below.

TABLE 1

| | Flame Retardancy | Hot Melt Adhesiveness (N/in) | Toughness (mm) | Surface Conductivity Length/Width (Ω) | Shielding Property (dB) | | Environmental Durability |
|---|---|---|---|---|---|---|---|
| | | | | | 10 MHz | 100 MHz | Discoloration/Corrosion |
| Example 1 | V-0 | 20 | 51 | 0.02/0.03 | 90 | 88 | Not discolored |
| Example 2 | V-0 | 20 | 56 | 0.03/0.03 | 88 | 87 | Not discolored |
| Comparative Example 1 | V-2 | 20 | 52 | 0.04/0.03 | 91 | 89 | Not discolored |
| Comparative Example 2 | V-0 | 20 | 53 | 0.25/0.34 | 67 | 60 | Discolored |
| Comparative Example 3 | V-0 | 20 | 76 | 0.03/0.04 | 90 | 87 | Not discolored |
| Comparative Example 4 | V-0 | 20 | 52 | 0.02/0.03 | 90 | 88 | Not discolored |

As to Examples 1 and 2, there could be obtained flame-retardant metal-coated fabrics not containing a halogen compound or an antimony compound, having such a high degree of flame retardancy as UL94 V-0 and excellent flexibility and electromagnetic wave shielding properties and yet suppressed in discoloration and corrosion of metal coating. However, in Comparative Example 1, it was impossible to attain satisfactory flame retardancy because an inappropriate blending ratio of components. In Comparative Example 2, desired flame retardancy was satisfied because a cyclic phosphonic ester, which is a phosphorus-based flame retardant other than ammonium polyphosphate and/or melamine polyphosphate, was used as the flame retardant (A), but there were recognized discoloration and corrosion of metal coating. Thus the metal-coated fabric obtained was impracticable. In Comparative Example 3, because of a large number of laminated resin layers, the texture was hard, the flexibility required of a gasket was not attained, and the number of manufacturing steps increased, which is undesirable from the economic standpoint. Comparative Example 4 satisfies all the evaluation items, but gives no consideration to the environment because it uses both halogen compound and antimony compound.

What is claimed is:

1. A flame-retardant metal-coated fabric useful for a gasket, comprising a metal-coated fabric and a flame-retardant coating layer formed on at least one side of the metal-coated fabric, the metal-coated fabric comprising a synthetic fiber, the flame-retardant metal-coated fabric being flame retardant in accordance with a testing method UL94 V-0, the flame-retardant coating layer comprising a mixture (F) of the following components (A), (B), (C), (D), and (E):
   (A) a flame-retardant selected from the group consisting of ammonium polyphosphate and melamine polyphospate;
   (B) a flame-retardant aid selected from the group consisting of melamine, melamine cyanurate, and tris (2-hydroxyethyl) isocyanate;
   (C) a blowing agent selected from the group consisting of heat-expandable graphite, azodicarbonamide, and N,N'-dinitrosopentamethylenetetramine;
   (D) a phosphoric ester; and
   (E) a thermoplastic resin having a melting point of 7-130° C., the ratio of (A):(B):(C):(D):(E) being 15-100:50-100:30-60:15-50:100 in weight ratio
   wherein the flame-retardant metal-coated fabric does not contain a halogen compound or an antimony compound.

2. A flame-retardant metal-coated fabric as set forth in claim 1, wherein the phosphoric ester (D) has a phosphorus content of 6-11% by weight and does not contain halogen.

3. A flame-retardant metal-coated fabric as set forth in claim 2, wherein the thermoplastic resin (E) is selected from the group consisting of urethane resin, acrylic resin and polyester resin.

4. A gasket for electromagnetic wave shielding, comprising a core formed by a synthetic resin foam having a flame retardancy and the flame-retardant metal-coated fabric described in claim 3, the flame retardant metal-coated fabric being wound round the outside of the core.

5. A flame-retardant metal-coated fabric as set forth in claim 3, wherein the weight of the flame-retardant coating layer comprising the mixture (F) is 100-300% by weight based on the weight of the metal-coated fabric.

6. A gasket for electromagnetic wave shielding, comprising a core formed by a synthetic resin foam having a flame retardancy and the flame-retardant metal-coated fabric described in claim 5, the flame-retardant metal-coated fabric being wound round the outside of the core.

7. A flame-retardant metal-coated fabric as set forth in claim 2, wherein the weight of the flame-retardant coating layer comprising the mixture (F) is 100-300% by weight based on the weight of the metal-coated fabric.

8. A gasket for electromagnetic wave shielding, comprising a core formed by a synthetic resin foam having a flame retardancy and the flame-retardant metal-coated fabric described in claim 7, the flame retardant metal-coated fabric being wound round the outside of the core.

9. A gasket for electromagnetic wave shielding, comprising a core formed by a synthetic resin foam having a flame retardancy and the flame-retardant metal-coated fabric described in claim 2, the flame retardant metal-coated fabric being wound round the outside of the core.

10. A flame-retardant metal-coated fabric as set forth in claim 1, wherein the thermoplastic resin (E) is selected from the group consisting of urethane resin, acrylic resin and polyester resin.

11. A flame-retardant metal-coated fabric as set forth in claim 10, wherein the weight of the flame-retardant coating layer comprising the mixture (F) is 100-300% by weight based on the weight of the metal-coated fabric.

12. A gasket for electromagnetic wave shielding, comprising a core formed by a synthetic resin foam having a flame retardancy and the flame-retardant metal-coated fabric described in claim 11, the flame retardant metal-coated fabric being wound round the outside of the core.

13. A gasket for electromagnetic wave shielding, comprising a core formed by a synthetic resin foam having a flame retardancy and the flame-retardant metal-coated fabric described in claim 10, the flame retardant metal-coated fabric being wound round the outside of the core.

14. A flame-retardant metal-coated fabric as set forth in claim 1, wherein the weight of the flame-retardant coating layer comprising the mixture (F) is 100-300% by weight based on the weight of the metal-coated fabric.

15. A gasket for electromagnetic wave shielding, comprising a core formed by a synthetic resin foam having a flame retardancy and the flame-retardant metal-coated fabric described in claim 14, the flame retardant metal-coated fabric being wound round the outside of the core.

16. A gasket for electromagnetic wave shielding, comprising a core formed by a synthetic resin foam having a flame retardancy and the flame-retardant metal-coated fabric described in claim 1, the flame retardant metal-coated fabric being wound round the outside of the core.

* * * * *